(12) United States Patent
Wawer et al.

(10) Patent No.: US 6,645,812 B2
(45) Date of Patent: Nov. 11, 2003

(54) METHOD FOR FABRICATING A NON-VOLATILE SEMICONDUCTOR MEMORY CELL WITH A SEPARATE TUNNEL WINDOW

(75) Inventors: Peter Wawer, Dresden (DE); Oliver Springmann, Dresden (DE); Konrad Wolf, Otterfing (DE); Olaf Heitzsch, Coswig (DE); Kai Huckels, Wolfsburg (DE); Reinhold Rennekamp, Dresden (DE); Mayk Röhrich, Görlitz (DE); Elard Stein Von Kamienski, Dresden (DE); Christoph Kutter, Dresden (DE); Christoph Ludwig, Langebrück (DE)

(73) Assignee: Infineon Technologies AG, Munich (DE)

( * ) Notice: Subject to any disclaimer, the term of this patent is extended or adjusted under 35 U.S.C. 154(b) by 25 days.

(21) Appl. No.: 10/033,949

(22) Filed: Dec. 28, 2001

(65) Prior Publication Data

US 2002/0119626 A1 Aug. 29, 2002

Related U.S. Application Data

(63) Continuation of application No. PCT/DE00/01769, filed on May 30, 2000.

(30) Foreign Application Priority Data

Jun. 28, 1999 (DE) .......................................... 199 29 618

(51) Int. Cl.[7] ............................................ H01L 21/336

(52) U.S. Cl. ..................... 438/257; 438/258; 438/259; 438/264; 438/265; 438/266; 257/321; 365/185.04; 365/185.09

(58) Field of Search ................................. 438/257–259, 438/264–266; 257/321, 315–319; 365/185.04, 185.05, 185.06, 185.09, 185.14

(56) References Cited

U.S. PATENT DOCUMENTS

| 4,794,562 A | | 12/1988 | Kato et al. |
| 5,371,031 A | * | 12/1994 | Gill et al. .................. 438/264 |
| 5,565,371 A | | 10/1996 | Gill |
| 5,633,186 A | | 5/1997 | Shum et al. |
| 5,844,268 A | | 12/1998 | Noda et al. |

FOREIGN PATENT DOCUMENTS

| EP | 0 055 408 A1 | 7/1982 |
| EP | 0 100 572 A2 | 2/1984 |
| EP | 0 655 785 A2 | 5/1995 |
| EP | 0 905 790 A2 | 3/1999 |

* cited by examiner

*Primary Examiner*—D Le
(74) *Attorney, Agent, or Firm*—Laurence A. Greenberg; Werner H. Stemer; Gregory L. Mayback

(57) ABSTRACT

A method for producing a non-volatile semiconductor memory cell with a separate tunnel window cell includes the step of forming a tunnel zone in a late implantation step by performing a tunnel implantation with the aid of a tunnel window cell as a mask. The resulting memory cell has a small area requirement and a high number of program/clear cycles.

10 Claims, 3 Drawing Sheets

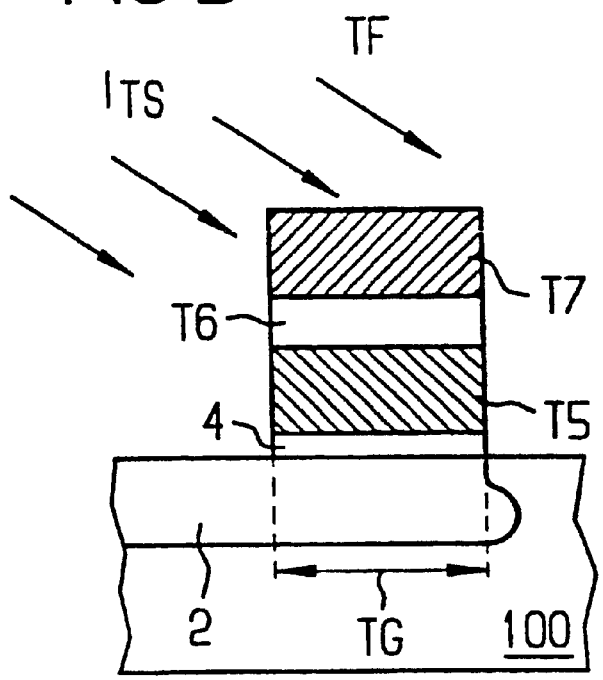
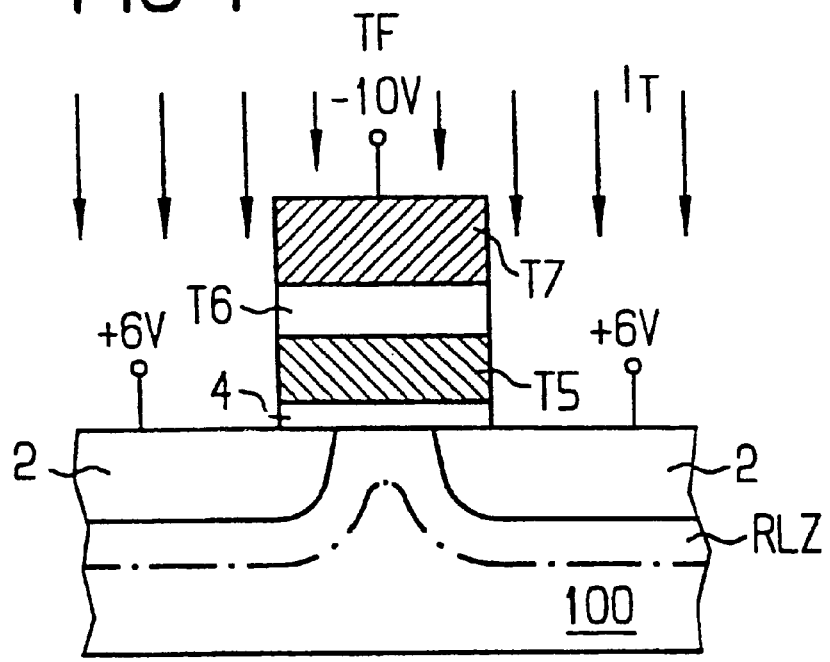

METHOD FOR FABRICATING A NON-VOLATILE SEMICONDUCTOR MEMORY CELL WITH A SEPARATE TUNNEL WINDOW

CROSS-REFERENCE TO RELATED APPLICATION

This application is a continuation of copending International Application No. PCT/DE00/01769, filed May 30, 2000, which designated the United States.

BACKGROUND OF THE INVENTION

Field of the Invention

The invention relates to a method for fabricating a non-volatile memory cell with a separate tunnel window and particularly a method for fabricating an EEPROM (Electrically Erasable Programmable Read-Only Memory) cell with a small space requirement and a high number of program/clear cycles.

Rewritable non-volatile semiconductor memory cells are gaining increasing significance in highly integrated circuits because of their ability to store modifiable data in chip cards over a long time period without requiring a voltage supply.

It is possible to distinguish between EEPROMs, EPROMs and FLASH-EPROM memories, depending on the non-volatile semiconductor memory cells that are used.

FIG. 5 is a sectional view of a conventional EEPROM memory cell SZ, which is substantially formed of a tunnel window cell TF and a transistor memory cell TZ. According to FIG. 5, the transistor memory cell TZ is formed of a relatively thick gate layer 3, which is relatively insensitive to leakage currents, an overlying floating gate layer 5, a dielectric layer 6, and a control electrode layer 7. A charge which is introduced into the floating gate layer 5 determines the switching behavior of the corresponding field effect transistor, which is driven by way of source/drain zones 1 and the control electrode layer 7. For introducing the charges in the floating gate layer 5, the memory cell includes the tunnel window cell TF, which has substantially the same layer sequence as the transistor memory cell TZ, though there is an insulating layer formed of a very thin tunnel layer 4 between a semiconductor substrate 100 and the floating gate layer 5.

In the fabrication of this conventional EEPROM memory cell SZ, first an ion implantation is carried out in the region of the tunnel window cell TF for purposes of forming a homogenous tunnel zone 2'. Next, the insulating tunnel layer 4, i.e. gate layer 3, and the floating gate layer 5, dielectric layer 6, and control electrode layer 7 are applied. Lastly, in one (or more) additional ion implantations the source/drain zones 1 are formed in the semiconductor substrate 100 in self-aligning fashion with the aid of the memory cell SZ as the mask. This way, an extremely high-grade rewritable non-volatile semiconductor memory cell is obtained, which has a very good endurance. The endurance refers to the number of program/clear cycles and is approx. $10^6$ cycles in conventional EEPROMs of this kind.

The disadvantage of these conventional EPROMs is the large area required for the memory cell SZ, for which reason they can be utilized in highly integrated circuits only under certain conditions.

In contrast, FLASH-EPROM memory cells have an extraordinarily small area requirement. FIG. 6 represents a section of a conventional FLASH-EPROM memory cell, wherein a tunnel oxide layer 4, a floating gate layer 5, a dielectric layer 6 and a control electrode layer 7 are stacked on a semiconductor substrate 100. In order to form a tunnel zone in a tunnel window region TF' of the FLASH-EPROM memory cell, implantation zones 2 are formed in the semiconductor substrate 100 in self-aligning fashion with the aid of the stacked memory cell. Next, source/drain zones 1 are incorporated in the semiconductor substrate 100 in self-aligning fashion with the aid of the memory cell and additional auxiliary layers or spacers 8. In this conventional FLASH-EPROM memory cell, as in the above described EEPROM memory cell, a charge is implanted in the floating gate layer 5 by the injection of hot charge carriers and/or Fowler-Nordheim tunneling in the tunnel window region TF' via the tunnel layer 4. The implanted charge carriers will subsequently determine the switching behavior of a transistor cell region TZ'.

Despite the significantly smaller area required by this conventional FLASH-EPROM memory cell, this type of non-volatile memory cell has a substantial disadvantage in that its endurance (i.e. the number of program/clear cycles) is significantly poorer than that of the conventional EEPROM memory cell represented in FIG. 4. Usually the endurance of these FLASH-EPROM memory cells is approx. $10^3$ cycles.

A significant disadvantage of these rewritable conventional non-volatile memory cells is that they can be combined into a common integrated circuit only under certain conditions. This is particularly attributable to the fact that the implantation of the tunnel zone 2', which is carried out beforehand according to FIG. 5, influences the thickness of the subsequent tunnel layer 4. In other words, given the utilization of the same fabrication process, a tunnel layer 4 for a tunnel window cell TF as represented in FIG. 5 will have a different thickness than in the FLASH-EPROM memory cell represented in FIG. 6. Furthermore, the implantation zone 2' represented in FIG. 5 is very sensitive to thermal post-processing, whereas the implantation zone 2 represented in FIG. 6 is formed relatively late in the fabrication process. For these reasons, different program/clear voltages arise for the memory cells according to FIG. 4 and FIG. 5, which are formed in the same integrated circuit.

U.S. Pat. No. 5,565,371 also describes a method for fabricating a non-volatile semiconductor memory cell with a separate tunnel window, wherein the transistor memory cell is programmed by the injection of hot charge carriers, and the transistor memory cell is cleared via Fowler-Nordheim tunneling. The disadvantage of this is the extraordinarily large area requirement and the introduction of a number of nonstandard fabrication processes. It is therefore impossible to combine this method with conventional methods.

SUMMARY OF THE INVENTION

It is accordingly an object of the invention to provide a method for fabricating a non-volatile semiconductor memory cell having a separate tunnel window which overcomes the above-mentioned disadvantages of the heretofore-known memory cells of this general type and which reduces the area requirement of the memory cell while improving the endurance, given the utilization of standard fabrication processes.

With the foregoing and other objects in view there is provided, in accordance with the invention, a method for fabricating a non-volatile semiconductor memory cell having a separate tunnel window, the method includes the steps of:

forming a tunnel window cell by forming a tunnel zone, a tunnel layer, a tunnel window memory layer, a dielectric tunnel window layer and a tunnel window control electrode layer;

forming a transistor memory cell with a channel zone, a gate layer, a memory layer, a dielectric layer and a control electrode layer;

forming the tunnel window cell and the transistor memory cell in active regions of a semiconductor substrate such that the transistor memory cell and the tunnel window cell are separated from one another;

forming a connecting region for connecting the tunnel window cell with the transistor memory cell in an inactive region of the semiconductor substrate; and doping the tunnel zone in an active region of the tunnel window cell subsequent to forming the tunnel layer.

In particular by forming tunnel zones in the active region of the tunnel window cells subsequent to the formation of the tunnel layer, it is possible to create a non-volatile semiconductor memory cell which is equal to a conventional EEPROM cell with respect to its endurance, i.e. program/clear cycles, but significantly improved with respect to its space requirements. Beyond this, a memory cell so fabricated can easily be realized in a common integrated circuit with conventional FLASH-EPROM cells using standard processes. The useful voltages (program/clear/read voltages) can be the same for a wide variety of forms of non-volatile semiconductor memory cells.

The tunnel zones are formed by implantation in self-aligning fashion with the aid of at least one layer of the tunnel window cell. In particular, for high-density circuits with structural sizes $\leq 1$ $\mu$m, memory cells can be easily and reliably fabricated in this way. The implantation can be performed vertically and/or diagonally into the region beneath the tunnel layer, whereby implantation zones completely below the tunnel layer touch or are formed so close to one another that their space charge zones or depletion zones perform what is known as a punch-through effect when an operating voltage is applied. In other words, the tunnel zones are configured such that space charge zones of the implantation zones extend completely into a region under the tunnel layer when an operating voltage is applied. This way, a very homogenous tunnel zone is obtained beneath the tunnel layer, which is comparable to a tunnel zone that is implanted beforehand, so that uniform field intensities arise during programming/erasing, and the endurance is improved.

Expediently, a floating gate connecting region and a control electrode connecting region are formed simultaneously with the appertaining floating gate layers and control electrode layers of the tunnel window cell and the transistor memory cell, thereby guaranteeing a further simplification of the fabrication process.

Another mode of the method according to the invention includes the step of forming a memory layer connecting region simultaneously with the memory layer and the tunnel window memory layer.

Yet another mode of the method according to the invention includes the step of forming a control electrode connecting region simultaneously with the control electrode layer and the tunnel window control electrode layer.

Another mode of the method according to the invention includes the step of forming the tunnel zone by using an MD (Matrix Drain) implantation or an LDD (Lightly Doped Drain) implantation.

A further mode of the method according to the invention includes the step of forming an EEPROM memory cell from the transistor memory cell and the tunnel window cell.

Other features which are considered as characteristic for the invention are set forth in the appended claims.

Although the invention is illustrated and described herein as embodied in a method for fabricating a non-volatile semiconductor memory cell with a separate tunnel window, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is an enlarged diagrammatic partial sectional view of a tunnel window cell according to a second exemplary embodiment according to the invention;

FIG. 4 is an enlarged diagrammatic partial sectional view of a tunnel window cell according to a third exemplary embodiment according to the invention;

DESCRIPTION OF THE PREFERRED EMBODIMENTS

Figure 1:
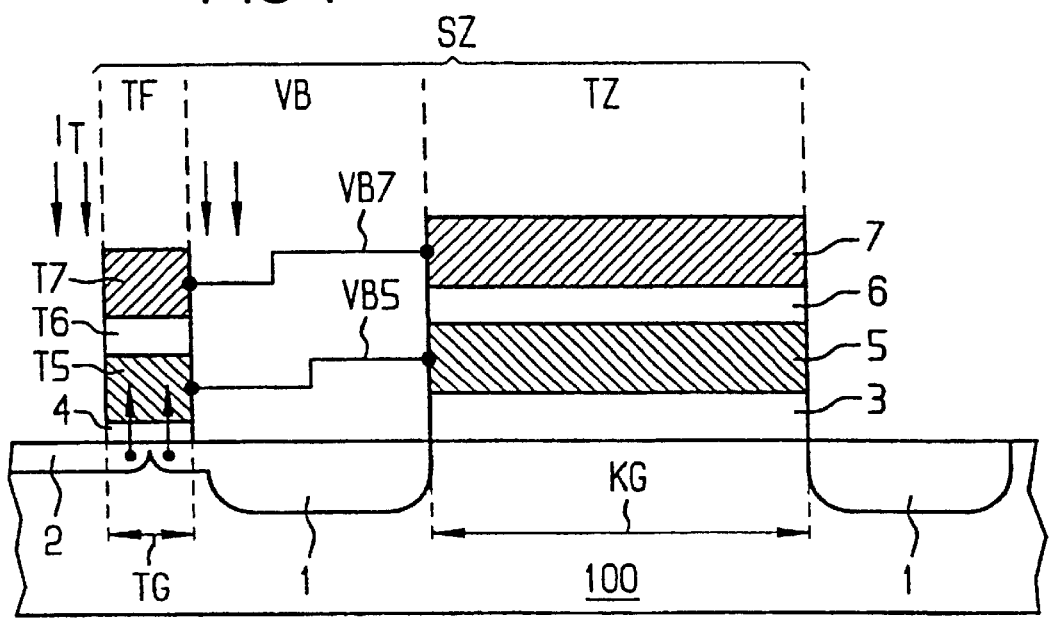
FIG. 1 is a diagrammatic partial sectional view of a non-volatile semiconductor memory cell with a separate tunnel window according to a first exemplary embodiment according to the invention.
Figure 5:
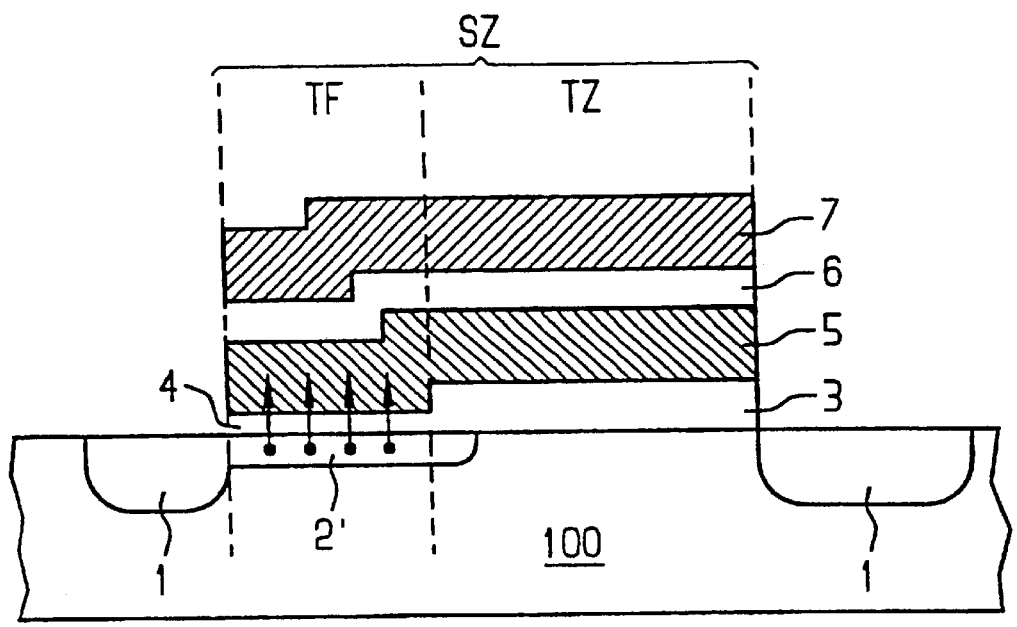
FIG. 5 is a diagrammatic partial sectional view of an EEPROM memory cell according to the prior art.
Figure 6:
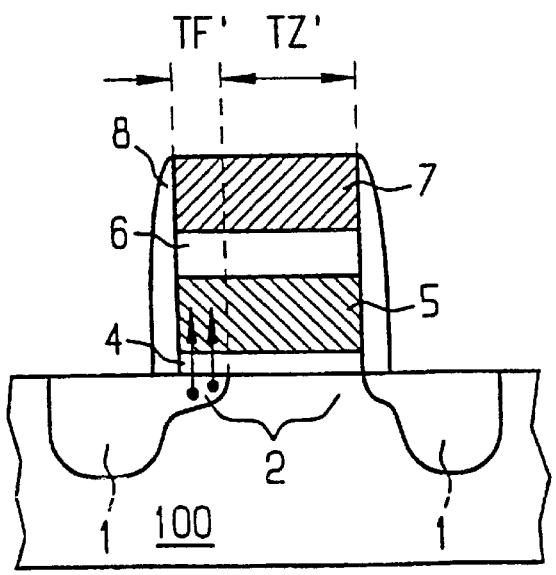
FIG. 6 is a diagrammatic partial sectional view of a FLASH-EPROM memory cell according to the prior art.

Referring now to the figures of the drawings in detail and first, particularly, to FIG. 1 thereof, there is shown a schematic sectional view of a non-volatile semiconductor memory cell with a separate tunnel window according to a first exemplary embodiment. Identical reference characters reference the same or similar layers or components as in FIGS. 5 and 6, and therefore a detailed descriptions will be omitted.

According to FIG. 1, a transistor memory cell TZ, a tunnel window cell TF and a connecting region VB are formed on a semiconductor substrate 100. The transistor memory cell TZ, the connecting region VB, and the tunnel window cell TF represent an actual memory cell SZ. The semiconductor substrate 100 is expediently formed of Si, though it may also be a III-V compound semiconductor or some other semiconductor substrate. The memory cell SZ can be realized as a PMOS (Positive-Channel Metal Oxide Semiconductor) cell, an NMOS (Negative-Channel Metal Oxide Semiconductor) cell or a CMOS (Complementary Metal Oxide Semiconductor) cell in the semiconductor substrate 100, whereby corresponding p troughs and/or n troughs are provided.

According to FIG. 1 the transistor memory cell TZ is formed of an insulating gate layer 3 such as thermally formed $SiO_2$. Over the gate layer 3 is a conductive floating gate layer 5 (poly-Si) for storing charges. In correspondence with the charges stored in the floating gate, a channel zone KG located beneath the gate layer 3 becomes conductive or nonconductive, whereby the logic information 0 or 1 can be respectively read during the reading of the memory cell SZ. A control electrode layer 7 which is insulated by a dielectric layer 6 from the floating gate layer 5 is provided for driving the transistor memory cell TZ or memory cell SZ. This way, the charge held in the floating gate layer 5 cannot drain off into the semiconductor substrate 100 or the control electrode layer 7. Spaced from the transistor memory cell TZ in FIG. 1 is a tunnel window cell TF, which communicates with the transistor memory cell TZ via a connecting region VB and which serves for writing/erasing through the use of hot charge carrier injection and/or Fowler-Nordheim tunneling.

The tunnel window cell TF advantageously is formed of the same layers as the transistor memory cell TZ, whereby only a tunnel layer 4 has a sufficiently small thickness for the tunneling. The tunnel layer 4 advantageously is formed of a tunnel oxide layer such as $SiO_2$. An overlying tunnel window floating gate layer T5 expediently is formed of the same material as the floating gate layer 5 of the transistor memory cell TZ and is insulated from the electrically conductive tunnel window control electrode layer T7 by a dielectric tunnel window layer T6. Like the dielectric layer 6, the dielectric tunnel window layer T6 is formed of an ONO (oxide/nitride/oxide) layer sequence, though it can also be formed of some other insulating dielectric layer. Like the control electrode layer 7 and the floating gate layer 5, the conductive tunnel window control electrode layer T7 and the conductive tunnel window floating gate layer T5 are formed of poly-Si but may also be formed of some other conductive and/or charge-storing material.

The connecting region VB usually is formed of the same layer sequence as the transistor memory cell TZ or the tunnel window cell TF, whereby the control electrode layer 7 communicates with the tunnel window control electrode layer T7 via a control electrode connecting region VB7, and the floating gate layer 5 communicates with the tunnel window floating gate layer T5 via a floating gate connecting region VB5. But the control electrode connecting region 7 and the floating gate connecting region 5 can also be realized through the use of metallic conductive tracks and/or diffusion regions in the semiconductor substrate 100.

What is essential to the invention is the mutually isolated formation of the transistor memory cell TZ and the tunnel window cell TF, which can be realized by a suitable etching and/or photolithography technique. The tunnel window cell TF can have a projection, a nose, or some other geometric structure given which a double-sided implantation can be accomplished by a tunnel implantation $I_T$.

Accordingly, in FIG. 1 a tunnel zone TG is formed by a tunnel implantation $I_T$ which is performed relatively late in the fabrication process and which corresponds to a tunnel implantation in simultaneously fabricated FLASH-EPROM memory cells. In this fashion, both the tunnel window cells TF of the memory cell SZ and the tunnel window areas of FLASH-EPROM memory cells, which are produced in the same process, can be formed. Because the tunnel layer 4 of the inventive memory cell SZ is preferably formed in the same fabrication step as a FLASH-EPROM memory cell, the two memory cells have the same electrical program/clear characteristics, thereby reducing the area requirement and improving the endurance.

The method for producing the non-volatile semiconductor memory cell will now be described in detail. First, active areas in the semiconductor substrate 100 are formed for the tunnel window cell TF and the transistor memory cell TZ through the use of an STI (Shallow Trench Isolation) process. The emerging trenches are filled with a deposited $SiO_2$ layer and then planarized. Similarly, a LOCOS (Local-Oxidation of Silicon) process can be used for insulating the active regions.

Next, the gate layer 3 and the tunnel layer 4 are formed and correspondingly structured at the active regions of the transistor memory cell TZ and the tunnel window cell TF. Next, the floating gate layer 5, the dielectric layer 6, and the control electrode layer 7 are applied and structured, producing the sectional view represented in FIG. 1.

According to FIG. 1, the STI layers are located in regions of the memory cell SZ which lie parallel to the sectional view that is represented in the Figure, which regions are not represented. Similarly, the control electrode connecting region VB7 and the floating gate connecting region VB5 reference the corresponding layers in a layer plane which is situated behind this section (in spatial terms). In order to form the tunnel window cell TF and the transistor memory cell TZ, an etching of the layers 3, 5, 6 and 7, or respectively 4, T5, T6 and T7, is subsequently performed, producing the stack-shaped cells TF and TZ which are represented in FIG. 1. In the subsequent tunnel implantation IT, an implantation zone 2 is formed in self-aligning fashion next to the stack-shaped tunnel window cell TF, whereby the tunnel zone TG is created under the tunnel layer 4 by scattering effects. In a subsequent source/drain implantation (which is not illustrated), source/drain zones 1 are then formed in self-aligning fashion between the tunnel window cell TF and on both sides of the transistor memory cell TZ. In this process, the tunnel window cell can utilize an auxiliary layer or spacer, which is not illustrated.

The source/drain zone 1 between the transistor memory cell TZ and the tunnel window cell TF thus creates contact both to the tunnel window cell TF and to the transistor memory cell TZ and serves both for reading and programming/erasing the memory cell SZ.

Figure 2:
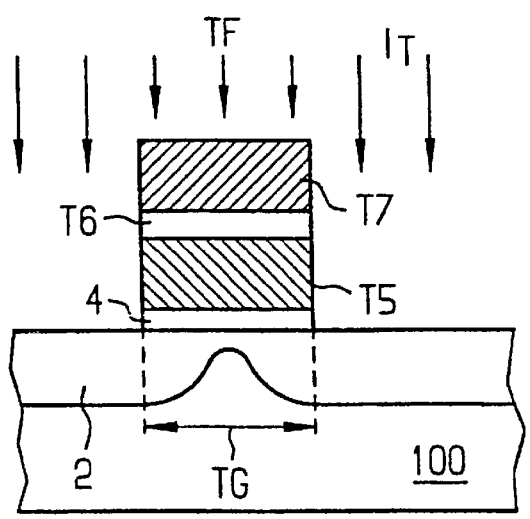
FIG. 2 is an enlarged diagrammatic partial sectional view of a tunnel window cell as shown in FIG. 1 according to the first exemplary embodiment according to the invention.

FIG. 2 represents an enlarged sectional view of the tunnel window cell TF represented in FIG. 1 during a tunnel implantation step. According to FIG. 2 a stack-shaped configuration of the tunnel layer 4, the tunnel window floating gate layer T5, the dielectric tunnel window layer T6 and the tunnel window control electrode layer T7 is located on a semiconductor substrate 100. After the structuring of this stack-shaped tunnel window cell TF, the actual tunnel implantation IT is performed for purposes of forming the tunnel zone TG under the tunnel layer 4. In this process, an implantation zone 2 is formed on both sides in self-aligning fashion with the aid of the stack-shaped tunnel window cell TF, in such a way that its ends touch beneath the tunnel layer 4, forming a homogenous tunnel zone TG.

This technique for forming implantation zones 2 is possible particularly given very small structural sizes under one $\mu$m, whereby scattering effects in the implantation are exploited to form the overlapping tunnel zones TG. For the implantation of n-zones, As is particularly well suited, because it has a small depth of penetration and a relatively high diffusion. But P and/or Sb can also be utilized for doping. Similarly, p-dopants can be utilized to form p-zones, provided they exhibit sufficient scattering beneath the tunnel layer 4 and thereby create a sufficiently homogenous tunnel region TG.

Alternatively to the perpendicular tunnel implantation $I_T$, according to FIG. 3 a diagonal tunnel implantation ITS can also be performed, with the implantation into the region beneath the tunnel layer 4 occurring at an angle of 5 to 8 degrees. The implantation zone 2 is formed in the semiconductor substrate 100 all the way into the region beneath the tunnel window cell TF acting as the mask from one side. A homogenous tunnel zone TG can also be generated beneath the tunnel layer 4 this way. Alternatively to the implantation ITs represented in FIG. 3 which is slanted on one side, the tunnel implantation into the region under the tunnel layer 4 can also slant in from a number of sides, for example from two sides.

According to FIG. 4, the tunnel implantation $I_T$ can also occur in such a way that the respective implantation zones 2 which are formed in the semiconductor substrate 100 do not touch, but rather extend only partly into the region under the tunnel layer 4. But the implantation zones 2 extend far enough under the tunnel layer 4 that the space charge zones RLZ of the implantation zones 2 touch when an operating voltage (e.g. program/clear voltage of e.g. −10 V/+6 V) is applied, producing what is known as a punch-through effect, whereby a homogenous tunnel zone is formed under the tunnel layer 4. In this case also a memory cell is achieved which is distinguished by an improved endurance, i.e. a higher number of program/clear cycles.

According to the invention, the tunnel implantation $I_T$ is preferably performed utilizing the entire tunnel window cell TF as the mask. But it is also possible to utilize only one of the layers in the tunnel window cell as the mask layer, or to utilize an additional mask layer in the form of a photosensitive resist layer and/or a hard-surface mask layer. LDD (Lightly Doped Drain) implantation or MD (Matrix Drain) implantation is expediently utilized for the tunnel implantation $I_T$, these being present in standard processes anyway.

It is also possible to utilize a different layer sequence than that described above (e.g. SONOX), provided that it is possible to form a rewritable non-volatile semiconductor memory cell this way.

We claim:

1. A method for fabricating a non-volatile semiconductor memory cell having a separate tunnel window, the method which comprises:

forming a tunnel window cell by forming a tunnel zone, a tunnel layer, a tunnel window memory layer, a dielectric tunnel window layer and a tunnel window control electrode layer;

forming a transistor memory cell with a channel zone, a gate layer, a memory layer, a dielectric layer and a control electrode layer;

forming the tunnel window cell and the transistor memory cell in active regions of a semiconductor substrate such that the transistor memory cell and the tunnel window cell are separated from one another;

forming a connecting region for connecting the tunnel window cell with the transistor memory cell in an inactive region of the semiconductor substrate; and doping the tunnel zone in an active region of the tunnel window cell subsequent to forming the tunnel layer.

2. The method according to claim 1, wherein the step of forming the tunnel zone includes forming implantation zones in a self-aligned manner by using at least one layer of the tunnel window cell as a mask.

3. The method according to claim 2, which comprises forming the implantation zones by performing at least one implantation selected from the group consisting of a vertical implantation and a diagonal implantation into a region under the tunnel layer.

4. The method according to claim 2, which comprises forming the tunnel zone such that the implantation zones extend completely under the tunnel layer.

5. The method according to claim 2, which comprises forming the tunnel zone such that space charge zones of the implantation zones extend completely under the tunnel layer when an operating voltage is applied.

6. The method according to claim 1, which comprises forming a memory layer connecting region simultaneously with the memory layer and the tunnel window memory layer.

7. The method according to claim 1, which comprises forming a control electrode connecting region simultaneously with the control electrode layer and the tunnel window control electrode layer.

8. The method according to claim 1, which comprises forming the tunnel zone by using an MD implantation.

9. The method according to claim 1, which comprises forming the tunnel zone by using an LDD implantation.

10. The method according to claim 1, which comprises forming an EEPROM memory cell configuration from the transistor memory cell and the tunnel window cell.

* * * * *